United States Patent
Kakitsuka et al.

(10) Patent No.: US 11,199,591 B2
(45) Date of Patent: Dec. 14, 2021

(54) CURRENT DETECTION CIRCUIT

(71) Applicants: Kabushiki Kaisha Toshiba, Tokyo (JP); Toshiba Electronic Devices & Storage Corporation, Tokyo (JP)

(72) Inventors: Yasuhiro Kakitsuka, Fujisawa Kanagawa (JP); Kazuyasu Minami, Yokohama Kanagawa (JP); Takaya Yasuda, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 32 days.

(21) Appl. No.: 16/802,064

(22) Filed: Feb. 26, 2020

(65) Prior Publication Data
US 2020/0379054 A1    Dec. 3, 2020

(30) Foreign Application Priority Data
May 27, 2019    (JP) .............................. JP2019-098774

(51) Int. Cl.
*G01R 31/52*    (2020.01)
*G01R 19/165*    (2006.01)

(52) U.S. Cl.
CPC ....... *G01R 31/52* (2020.01); *G01R 19/16504* (2013.01)

(58) Field of Classification Search
None
See application file for complete search history.

(56) References Cited

U.S. PATENT DOCUMENTS

| | | | | |
|---|---|---|---|---|
| 5,559,500 A | * | 9/1996 | Kase | ................ G01R 19/16538 |
| | | | | 323/315 |
| 10,333,303 B2 | | 6/2019 | Kobayashi et al. | |

FOREIGN PATENT DOCUMENTS

| | | |
|---|---|---|
| JP | 4685009 B2 | 5/2011 |
| JP | 5279252 B2 | 9/2013 |
| JP | 2017-195535 A | 10/2017 |
| JP | 6445192 B1 | 12/2018 |
| WO | 2005-091482 A1 | 9/2005 |

* cited by examiner

*Primary Examiner* — Jas A Sanghera
(74) *Attorney, Agent, or Firm* — Allen & Overy LLP

(57) ABSTRACT

A current detection circuit includes an N-type first transistor configured to supply a first current to an output terminal, an N-type second transistor that constitutes a current mirror circuit with the first transistor, a comparison circuit configured to output a detection result showing whether or not the first current is larger than a predetermined threshold based on a current flowing through the second transistor, a ground fault detection circuit configured to output a result detecting a ground fault of the output terminal, and a logical circuit configured to output a current detection signal showing whether or not the first current is an overcurrent based on the detection result of the comparison circuit and the ground fault detection result of the ground fault detection circuit.

8 Claims, 5 Drawing Sheets

CURRENT DETECTION CIRCUIT

CROSS-REFERENCE TO RELATED APPLICATION

This application is based upon and claims the benefit of priority from the prior Japanese Patent Application No. 2019-98774 filed in Japan on May 27, 2019; the entire contents of which are incorporated herein by reference.

FIELD

An embodiment of the present invention herein relates generally to a current detection circuit.

BACKGROUND

In a conventional driving circuit configured to supply a current to, for example, a motor or a power supply circuit, a current detection circuit may be provided in order to prevent an overcurrent. The current detection circuit detects a current flowing through an output transistor and detects an overcurrent based on whether or not a current value is larger than a threshold.

However, depending on conditions of a ground fault etc. of an output terminal, a problem that the current detection circuit may be incapable of detect an overcurrent is present.

DETAILED DESCRIPTION

A current detection circuit according to an embodiment includes an N-type first transistor configured to supply a first current to an output terminal, an N-type second transistor that constitutes a current mirror circuit with the first transistor, a comparison circuit configured to output a detection result showing whether or not the first current is larger than a predetermined, threshold based on a current flowing through the second transistor, a ground fault detection circuit configured to output a result detecting a ground fault of the output terminal, and a logical circuit configured to output a current detection signal showing whether or not the first current is an overcurrent based on the detection result of the comparison circuit and the ground fault detection result of the ground fault detection circuit.

Hereinafter, the embodiment of the present invention will be described in detail with reference to the accompanying drawings.

First Embodiment

Figure 1:
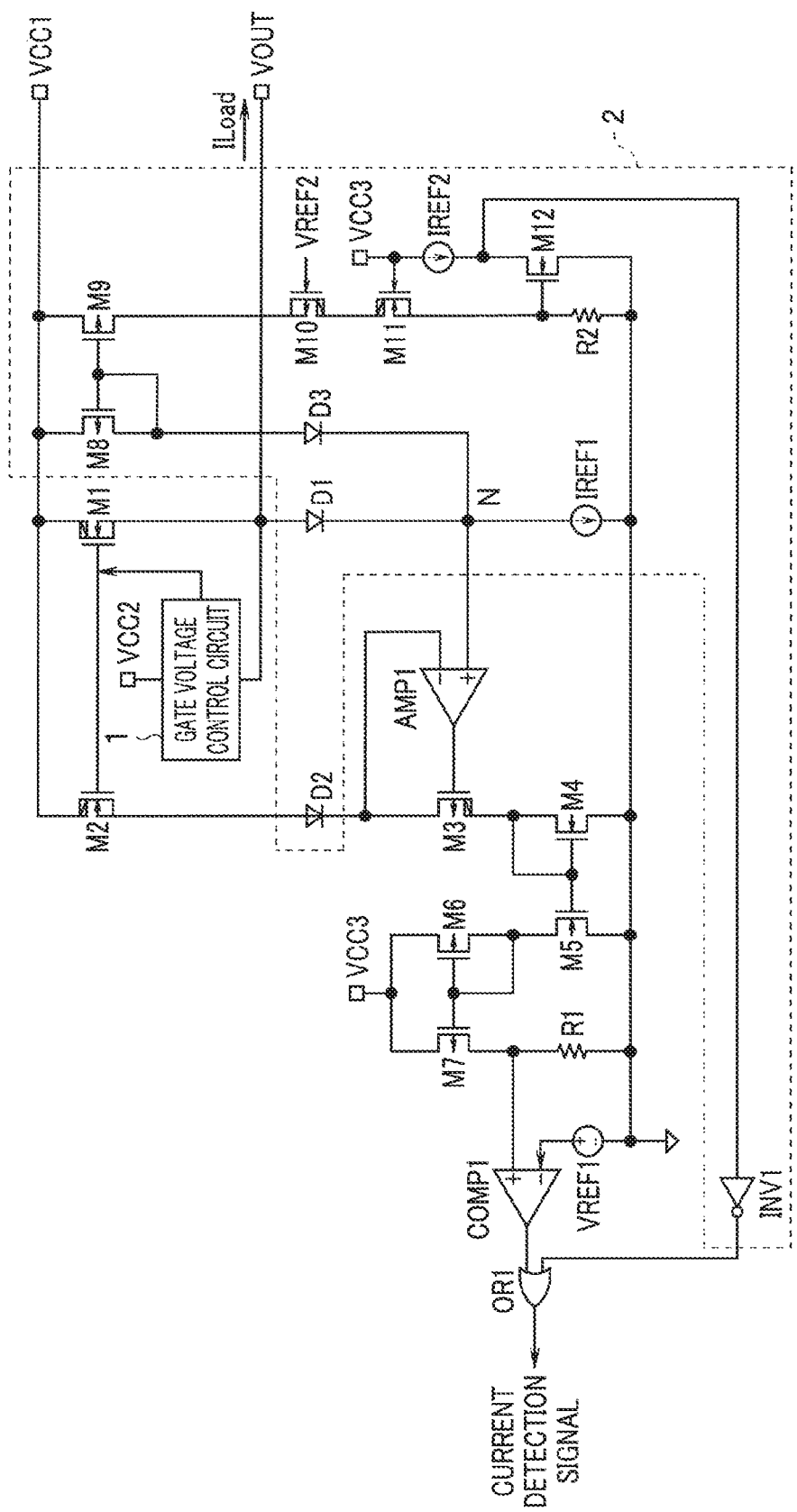
FIG. 1 is a circuit diagram showing a current detection circuit according to a first embodiment.
Figure 2:
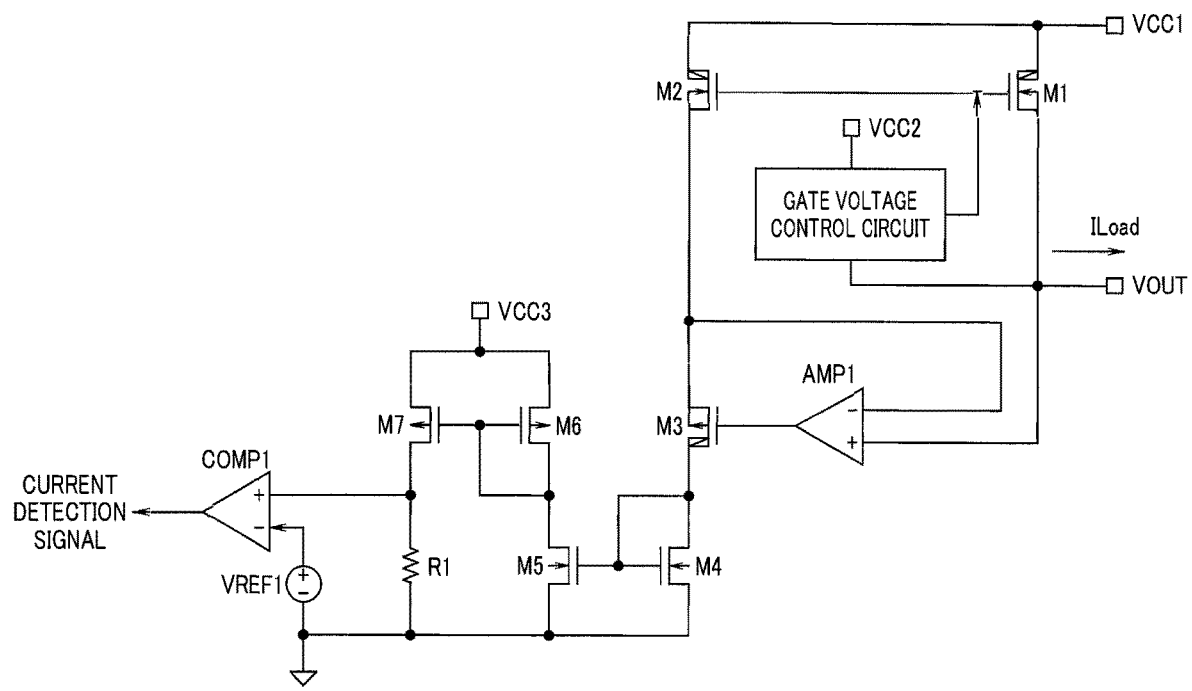
FIG. 2 is a circuit diagram showing related technology of the current detection circuit.

FIG. 1 is a circuit diagram showing a current detection circuit according to a first embodiment. Further. FIG. 2 is a circuit diagram showing related technology of the current detection circuit. The current detection circuit according to the present embodiment adds a circuit that performs a ground fault detection to a circuit that performs a current detection and detects an overcurrent based on a current detection result and a ground fault detection result. In FIGS. 1 and 2, the same components are denoted by the same reference numerals, and redundant description is omitted in the same components. For example, the current detection circuit shown in FIGS. 1 and 2 may configure a high side driver.

First, the related technology of the current detection circuit will be described with reference to FIG. 2. An N-type MOS transistor M1 is an output transistor configured to supply a current Woad to a load (not shown) connected to an output terminal VOUT. A drain of the transistor M1 is connected to a power supply terminal VCC1, a source of the transistor M1 is connected to the output terminal VOUT, and an output of a gate voltage control circuit 1 is applied to a gate of the transistor M1. The transistor M1 is driven by the gate voltage control circuit 1 and outputs the current ILoad corresponding to a drain-source voltage Vgs to the output terminal VOUT.

The gate voltage control circuit 1 operates while a voltage is applied from a power supply terminal VCC2 and supplies a voltage corresponding to a fluctuation in a load connected to the output terminal VOUT to the gate of the transistor M1 to thereby control the predetermined current ILoad to flow through.

An N-type MOS transistor M2 that constitutes a current mirror circuit with the transistor M1 is provided to detect the current ILoad. Specifically, a gate of the transistor M2 is connected to the gate of the transistor M1 and a drain of the transistor M2 is connected to the power supply terminal VCC1. Note that a size of the transistor M2 is $\alpha$ times the size of the transistor M1. A value a is a real number smaller than one and is an extremely small value. Accordingly, when a gate potential, a drain potential, and a source potential of the transistor M1 are the same as a gate potential, a drain potential, and a source potential of the transistor M2, respectively, a current $\alpha$ times the current ILoad flows through the transistor M2.

An operational amplifier AMP1 is adopted in order to make the source potential of the transistor M1 and the source potential of the transistor M2 the same. A positive input terminal of the operational amplifier AMP1 is connected to the source of the transistor M1 and a negative input terminal of the operational amplifier AMP1 is connected to a source of the transistor M2. An output terminal of the operational amplifier AMP1 is connected to a gate of a P-type MOS transistor M3. A source of the transistor M3 is connected to the source of the transistor M2 and a drain of the transistor M3 is connected to a reference potential point through a drain-source path of an N-type MOS transistor M4.

The operational amplifier AMP1 controls the transistor M3 to make the positive input terminal and the negative input terminal the same potential. Thereby, the current $\alpha \times $ILoad flows from the source of the transistor M2 to the reference potential point.

A gate of the transistor M4 is connected to a drain of the transistor M4, and at the same time, is also connected to a gate of an N-type MOS transistor M5 with which the transistor M4 constitutes a current mirror circuit. A drain of the transistor M5 is connected to a power supply terminal VCC3 through a drain-source path of a P-type MOS transistor M6 and a source of the transistor M5 is connected to the reference potential point.

In the transistor M6, a gate of the transistor M6 is connected to a drain of the transistor M6, and at the same time, is also connected to a gate of a P-type MOS transistor M7 with which the transistor M6 constitutes a current mirror circuit. A source of the transistor M7 is connected to the power supply terminal VCC3 and a drain of the transistor M7 is connected to the reference potential point via a resistor R1.

Through the current mirror circuit configured by the transistor M4 and the transistor M5, the current α×ILoad flowing through the drain-source path of the transistor M4 also flows through a source-drain path of the transistor M5 and a source-drain path of the transistor M6. Further, through the current mirror circuit configured by the transistor M6 and the transistor M7, the current α×ILoad flowing through the source-drain path of the transistor M6 also flows through a source-drain path of the transistor M7 and the resistor R1.

In a case in which a size ratio of the transistor M4 and the transistor M5 is 1:1 and a size ratio of the transistor M6 and the transistor M7 is 1:1, a voltage drop due to the resistor R1 having a resistance value R1 is equal to R1×α×ILoad. By using a comparator COMP1, the voltage drop is compared to a reference voltage VREF1 that imparts a threshold of an overcurrent to thereby detect the overcurrent.

A positive input terminal of the comparator COMP1 is connected to a connection point between the resistor R1 and the drain of the transistor M7 and a voltage due to the voltage drop of the resistor R1 is applied. A negative input terminal of the comparator COMP1 is connected to the reference potential point via the reference voltage source VREF1 and the reference voltage VREF1 is applied. The comparator COMP1 outputs a result of comparing two inputs as a current detection signal from an output terminal. In a ease of R1×α×ILoad>VREF1, comparison result becomes a high level. The comparison result becomes the high level, and thereby the comparator COMP1 is capable of detecting that the current ILoad becomes larger than VREF1/(R1×α) (overcurrent). Specifically, VREF1/(R1×α) is an overcurrent determination threshold determining whether or not the current ILoad is an overcurrent.

Figure 3:
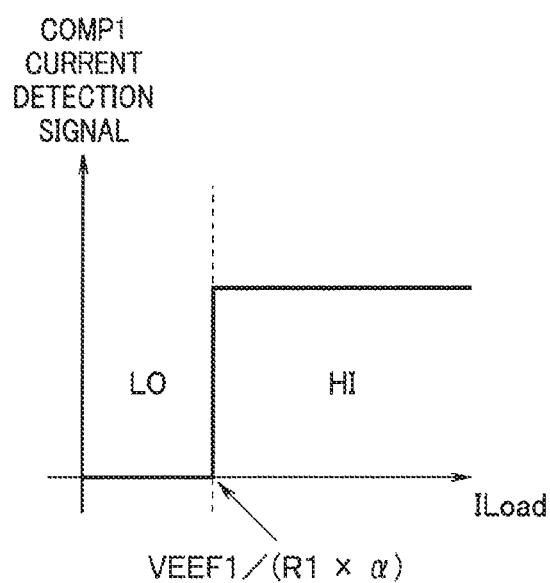
FIG. 3 is a waveform diagram describing operations of a comparator COMP1.

FIG. 3 is a waveform diagram describing operations of the comparator COMP1. A horizontal axis represents the current ILoad and a vertical axis represents the current detection signal from the comparator COMP1. In a case in which the current ILoad is equal to or smaller than the overcurrent determination threshold, the current detection signal becomes a low level (LO). On the other hand, in a case in which the current ILoad is larger than the overcurrent determination threshold, the current detection signal becomes the high level (HI).

Meanwhile, a ground fault may occur in the output terminal VOUT. As a result, the source of the transistor M1 is 0 V and the positive input terminal of the operational amplifier AMP1 is 0 V. In this state, the source of the transistor M2 is also required to be 0 V in order to accurately detect the current ILoad. However, the transistor M3 is turned on in a relatively small voltage Vsd. On the other hand, the voltage Vgs for turning on the transistor M4 is relatively large. Accordingly, in a source potential of the transistor M3 (source potential of the transistor M2), a minimum potential is restricted by the voltage Vgs of the transistor M4 and the minimum potential is incapable of being reduced up to 0 V. In the result, a current flowing through the source of the transistor M2 is not u times the current ILoad and the current ILoad is incapable of being accurately detected.

Figure 4:
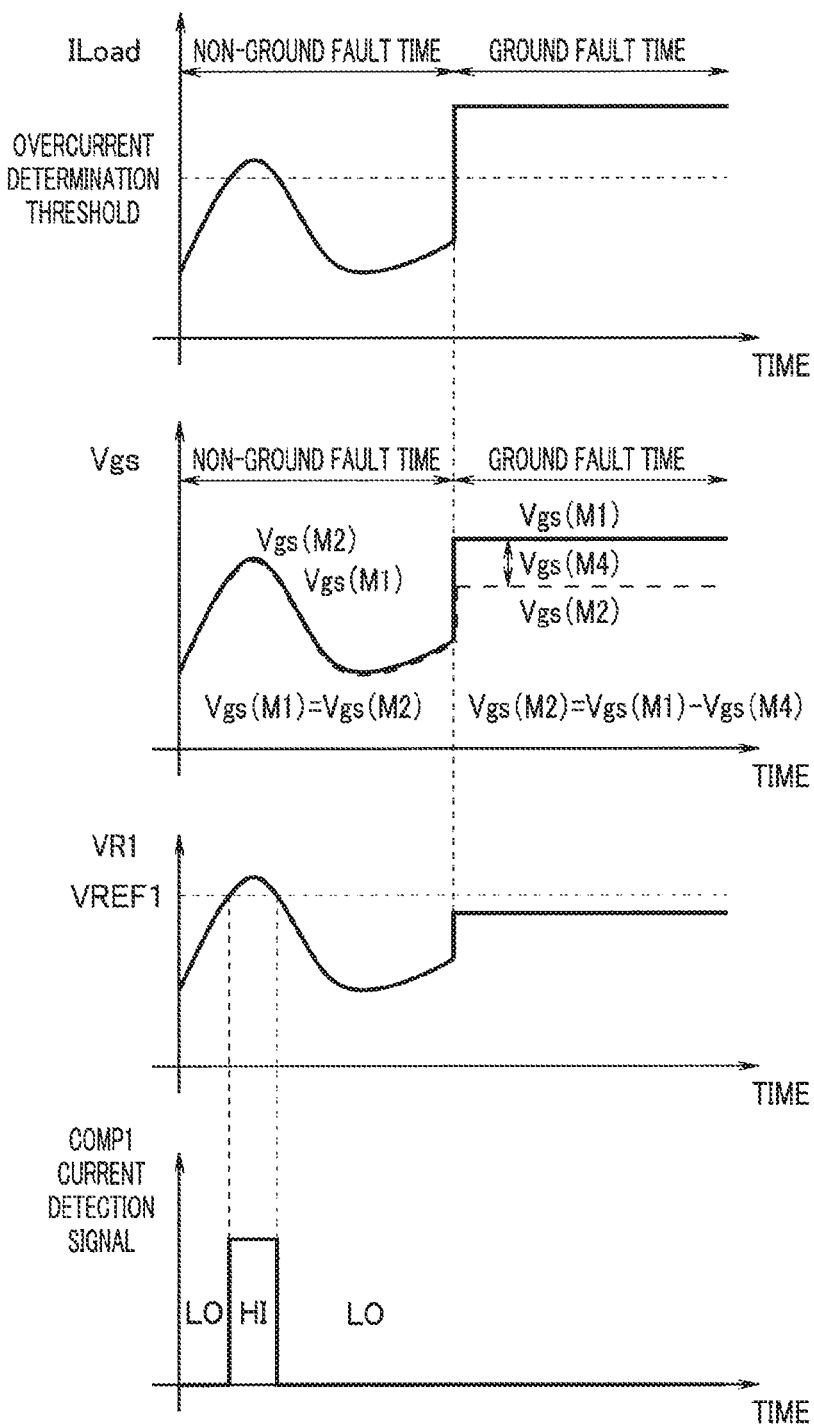
FIG. 4 is a timing chart describing a problem.

FIG. 4 is a timing chart describing the above problem. Note that, in the following descriptions, in the transistors, the drain-source voltage is set to the voltage Vgs, a drain-source voltage is set to a voltage Vds, a current flowing through the drain-source path is set to a current Ids, and a threshold voltage is set to a voltage Vth. Further, a sign attached to the transistor is enclosed in parentheses, and thereby showing a characteristic value of any transistor. Further, in the following descriptions, at the time of the ground fault, the ground fault occurs in the output terminal VOUT and at the time of a non-ground fault, the ground fault does not occur in the output terminal VOUT. In FIG. 4, a horizontal axis represents a time, and a time change in the current ILoad, the drain-source voltage Vgs, the voltage drop VR1 in the resistor R, and the current detection signal in the COMP1 are shown in this order from the top.

An example in which the current ILoad fluctuates at the time of the non-ground fault is shown. When the current ILoad is larger than the overcurrent determination threshold, an output of the comparator COMP1 is changed from the low level to the high level. In a case in which the current ILoad is equal to or smaller than the overcurrent determination threshold, the output of the comparator COMP1 becomes the low level.

At the time of the non-ground fault, when the current ILoad is larger than the overcurrent determination threshold, the comparator COMP1 outputs the current detection signal at the high level. At the time of the non-ground fault, the voltage Vgs (M1) in the transistor M1 coincides with the voltage Vgs (M2) in the transistor M2.

On the other hand, when the ground fault occurs in the output terminal VOUT, the source of the transistor M1 is 0 V, the voltage Vgs (M1) becomes large, and the current ILoad becomes larger than the overcurrent determination threshold. At this time, a value of the voltage Vgs (M2) is equal to a value lower than the value of the voltage Vgs (M1) by the voltage Vgs (M4) (second stage of FIG. 4). In the result, a current to be detected by the transistor M2 is reduced and a voltage drop due to the resistor R1 is equal to or lower than the voltage VREF1 (third stage of FIG. 4). Specifically, at the time of the ground fault, the output of the comparator COMP1 remains the low level as it is and the overcurrent is incapable of being detected (fourth stage of FIG. 4).

To solve the above problem, according to the present embodiment, a circuit 2 that performs a ground fault detection in the current detection circuit and an OR circuit OR1 that calculates a logical OR of outputs of the circuit 2 and the comparator COMP1 are adopted. At the time of the non-ground fault, the overcurrent is detected by the output of the comparator COMP1 and, at the time of the ground fault, the overcurrent is detected by an output of the circuit 2.

In FIG. 1, between the positive input terminal (hereinafter, referred to as a node N) of the operational amplifier AMP1 and a connection point between the source of the transistor M1 and the output terminal VOUT, a diode D1 is provided. An anode of the diode D1 is connected to the output terminal VOUT and a cathode of the diode D1 is connected to the node N. Further, the node N is connected to the reference potential point via a current source IREF1. Further, an anode of a diode D3 is connected to the power supply terminal VCC1 through a source-drain path of a P-type MOS transistor M8 and a cathode of the diode D3 is connected to the node N.

The current supply IREF1, the transistor M8, and the diode D1 are provided to detect an occurrence of the ground fault. At the time of the ground fault, the output terminal VOUT is turned out 0 V and thereby the diode D1 turned off. A current generated by the current source IREF1, that is, a current between the power supply terminal VCC1 and the node N flows in the reference potential point through the source-drain path of the transistor M8 and the diode D3. Specifically, the occurrence of the ground fault is detected by a current flowing through the transistor M8.

However, in order to accurately detect the current ILoad flowing through the transistor M1, the transistor M8 may be in an off state. To solve the above problem, in a case in which the current ILoad is equal to or smaller than the overcurrent determination threshold at the time of the non-ground fault, the transistor M8 is set to be turned off. Specifically, at the time of the non-ground fault, in a case in which the current ILoad is the overcurrent determination threshold VREF1/(R1×α), a voltage Vth (M8) of the transistor M8 is set to a value larger than a maximum drain-source voltage (Vds (M1) . . . max) of the transistor M1. In a case in which the conditions are satisfied, when the current ILoad equal to or smaller than the overcurrent determination threshold is supplied at the time of the non-ground fault, the transistor MB is necessarily turned off.

Note that, in an example of FIG. 1, only the diode D3 is connected between a drain of the transistor MB and the node N. Further, in a case in which Vds (M1)_max<Vth (M8) does not hold, m (m is an integer equal to or larger than one) diodes are additionally connected and Vds (M1)_max<Vth (M8)+VF (add)×m is caused to hold. The voltage VF (add) is a forward voltage of a diode to be added.

The operational amplifier AMP1 controls an output so that the positive input terminal and the negative input terminal have the same potential. Since the diode D1 is provided between the source of the transistor M1 and the node N, a diode D2 is also provided between the source of the transistor M2 and the negative input terminal of the operational amplifier AMP1.

Note that a current value of the current source IREF1 is set to IREF1<<ILoad. By adding the current source IREF1, the current Ids (M1) is changed into a sum current of the current ILoad and the current IREF1. Since the current IREF1 is sufficiently small in comparison with the current ILoad, a change in the voltage Vds (M1) is extremely small and a detection error of the current ILoad is negligible.

Further, in order to enhance a detection accuracy of the overcurrent, in a case in which the current ILoad is near to the overcurrent determination threshold, the source potential of the transistor M1 may be caused to coincide with the source potential of the transistor M2 by the operational amplifier AMP1. To solve the above problem, in a case in which the current ILoad has the overcurrent determination threshold, a forward voltage of the diode D1 is caused to coincide with a forward voltage of the diode D2. Specifically, in a case in which the current ILoad of the overcurrent determination threshold is supplied, the current IREF1 is set to a value approximately equal to the current Ids (M2) (=α×ILoad) of the transistor M2.

A gate of the transistor M8 is connected to the drain of the transistor M8, and at the same time is also connected to a gate of a P-type MOS transistor M9 with which the transistor M8 constitutes a current mirror circuit. A source of the transistor M9 is connected to the power supply terminal VCC1 and a drain of the transistor M9 is connected to the reference potential point through a source-drain path of a P-type MOS transistor M10, a drain-source path of an N-type MOS transistor M11, and a resistor R2.

A voltage VREF2 is applied to a gate of the transistor M10. Further, a gate of the transistor M11 is connected to the power supply terminal VCC3. The power supply terminal VCC3 is connected to the reference potential point through the current source IREF2 that configures an active load, and a drain-source path of an N-type MOS transistor M12. A gate of the transistor M12 is connected to a connection point between a source of the transistor M11 and the resistor R2. Note that a resistor may be adopted in place of the current source IREF2.

By the current mirror circuit configured by the transistor M8 and the transistor M9, the current IREF1 flowing through the transistor M8 flows through the resistor R2 from the transistor M9 via the transistor M10 and the transistor M11. When a size ratio of the transistor M8 and the transistor M9 is set to 1:1 and a resistance value of the resistor R2 is set to R2, a voltage drop due to the resistor R2 is equal to a voltage IREF1×R2. A threshold Vth (M12) of the transistor M12 is set to IREF1×R2>Vth (M12) to thereby turn on the transistor M12.

When the transistor M12 is turned off, a drain of the transistor M12 is changed into the high level by the power supply voltage VCC3, and when the transistor M12 is turned on, the drain of the transistor M12 is changed into the low level. Specifically, when the transistor M8 is turned from off to on, the drain of the transistor M12 is changed from the high level to the low level. A drain voltage of the transistor M12 is applied to an inverter INV1. The inverter INV1 inverts the drain voltage of the transistor M12 and outputs the inverted drain voltage to the OR circuit OR1. By using the resistor R2, the current source IREF2, the transistor M12, and the inverter INV1, a ground fault detection result output circuit is configured.

The OR circuit Ob1 outputs an output logical add of the comparator COMP1 and the inverter INV1 as the current detection signal.

The transistor M10 configures a voltage clamp of the transistor M9. Specifically, the voltage VREF2 is applied to the gate of the transistor M10, and thereby the transistor M10 maintains a potential of the drain of the transistor M9 at a predetermined value. Further, the transistor M11 is a voltage clamp of the transistor M12. Specifically, when a voltage drop of the resistor R2 is extremely large, the transistor M11 is turned off and acts so as to suppress the voltage Vgs (M12). Note that when there is no problem in an element withstand-voltage of the transistor M9 and the transistor M12, the transistor M10 and the transistor M11 can be omitted.

Further, in the related technology of FIG. 2, a large input voltage from the power supply voltage VCC1 to 0 V (at the time of the ground fault) is input to the positive input terminal of the operational amplifier AMP1. On the other hand, according to the present embodiment, the positive input terminal of the operational amplifier AMP1 is restricted to an input voltage from the power supply voltage VCC1 to VCC1−(Vgs (M8)+VF (D3)). VF (D3) is a forward voltage of the diode D3. Accordingly, according to the present embodiment, there is also an advantage such that a differential input circuit of the operational amplifier AMP1 is capable of being configured by low withstand-voltage elements.

Note that, also at the time of the non-ground fault, when the current ILoad larger than the overcurrent determination threshold is supplied, the transistor M8 may be turned on. Therefore, due to a value of the resistor R2, etc., an amount of the current ILoad, or the like, the transistor M12 is turned on and an output of the inverter INV1 becomes the high level. However, the high level showing the overcurrent is also output from the comparator COMP1, and therefore there is no problem particularly.

Figure 5:
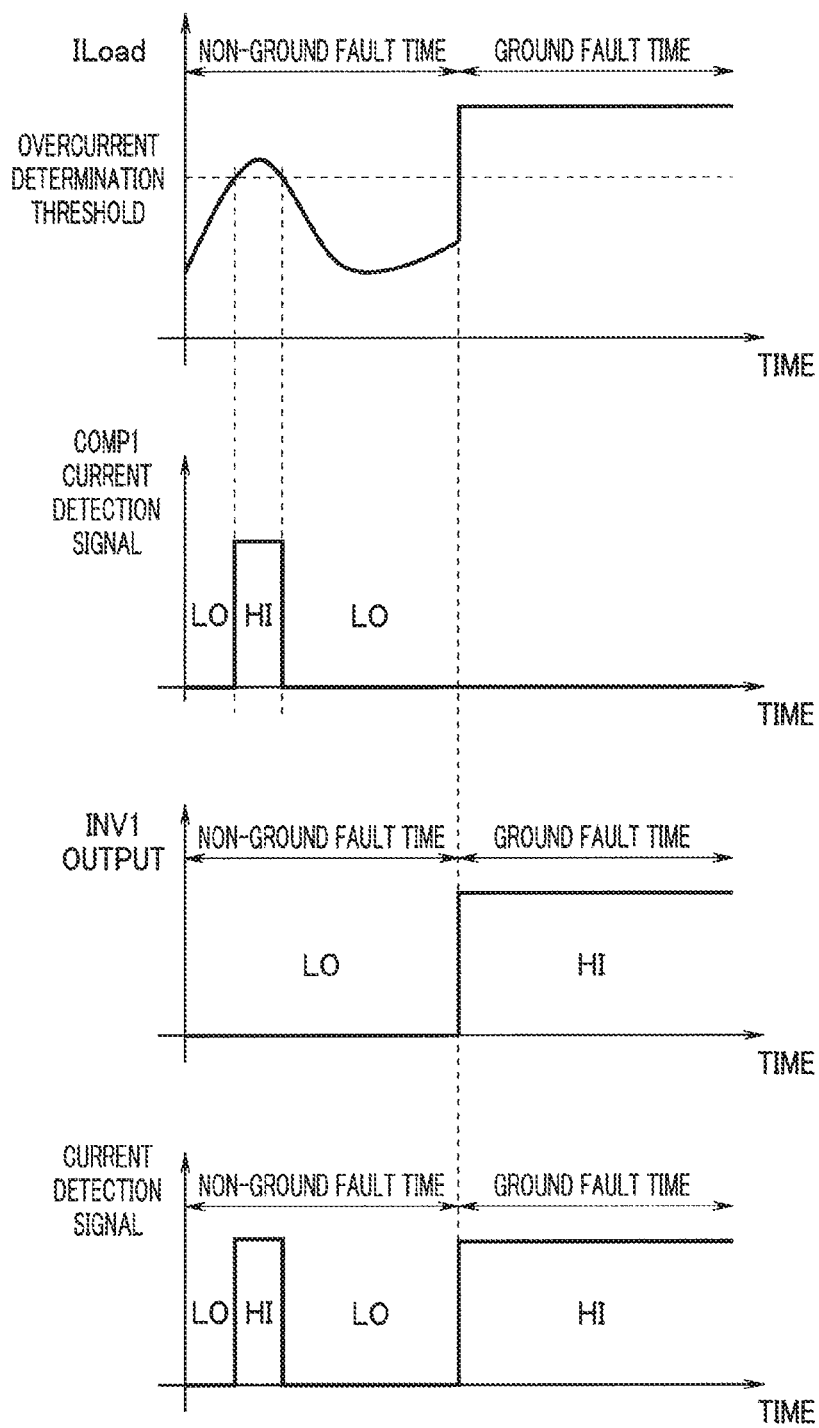
FIG. 5 is a timing chart describing operations according to the first embodiment.

Next, operations according to the present embodiment configured as described above will be described with reference to FIG. 5. FIG. 5 is a timing chart describing the operations according to the present embodiment. A horizontal axis represents a time; further, represents a time change in the current ILoad, the output of the COMP1, the output of the INV1, and an output of the OR1 in this order from the top.

(At Time of Non-Ground Fault)

At the time of the non-ground fault, the current ILoad is supposed to be equal to or less than VREF1/(R1×α). The overcurrent determination threshold shows VREF1/(R1×α). At the time of the non-ground fault, the current ILoad fluctuates and a period in which the current ILoad is larger than the overcurrent determination threshold is also included (first stage of FIG. 5).

In a case in which the current ILoad is equal to or smaller than the overcurrent determination threshold, the transistor M8 is turned off. Accordingly, the drain of the transistor M12 is the high level and the output of the inverter INV1 is the low level. Specifically, in this case, the circuit 2 does not exert an influence on the current detection signal.

As a result of acting so that the source potential of the transistor 1471 is made the same as the source potential of the transistor M2, Vds (M1)+VF (D1)=Vds (M2)+VP (D2) holds in the operational amplifier AMP1. A voltage VF (D1) and a voltage VP (D2) are a forward voltage of the diode D1 and a forward voltage of the diode D2, respectively. Since the current Ids (M2) is equal to α×ILoad, a voltage drop of a voltage ILoad×R1×α occurs in the resistor R1. The voltage drop ILoad×R1×α is equal to or lower than the voltage VREF1 and the output of the comparator COMP1 is the low level.

On the other hand, at the time of the non-ground fault, when the current ILoad is larger than the overcurrent determination threshold, the voltage drop ILoad×R1×α in the resistor R1 is higher than the voltage VREF1 and the output of the comparator COMM becomes the high level. In a case in which the current ILoad is larger than the overcurrent determination threshold, the current detection signal becomes the high level.

(At Time of Ground Fault)

At the time of the ground fault, the output terminal VOUT is 0 V, the diode D1 is turned off, and the voltage Vgs (M1) is increased. Then, the current ILoad is larger than the overcurrent determination threshold. As a result of turning off the diode D1, the current IREF1 flows through the transistor M8. A mirror current of the current IREF1 flows through the reference potential point via the transistor M10, the transistor M11, and the resistor R2 from the transistor M9. The voltage drop of the voltage IREF1×R2 occurs in the resistor R2 and the drain of the transistor M12 is changed from the high level to the low level.

Meanwhile, the output of the inverter INV1 is changed from the low level to the high level (third stage of FIG. 5). Then, the current detection signal from the OR circuit OR1 becomes the high level at the time of the ground fault.

As described above, according to the present embodiment, a circuit configured to detect the ground fault is added to a current detection circuit and the current detection signal is obtained by an output of a ground fault detection circuit at the time of the ground fault. At the time of the non-ground fault, an overcurrent is detected by the output of the comparator COMP1, and at the time of the ground fault, an overcurrent is detected by the output of the inverter INV1. Thereby, the current detection signal can be accurately obtained in either a non-ground fault time or a ground fault time.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A current detection circuit comprising:
   an N-type first transistor configured to supply a first current to an output terminal;
   an N-type second transistor that constitutes a current mirror circuit with the first transistor;
   a comparison circuit configured to output a detection result showing whether or not the first current is larger than a predetermined threshold based on a current flowing through the second transistor;
   a ground fault detection circuit configured to output a result detecting a ground fault of the output terminal; and
   a logical circuit configured to output a current detection signal showing whether or not the first current is an overcurrent based on the detection result of the comparison circuit and the ground fault detection result of the ground fault detection circuit.

2. The current detection circuit according to claim 1, wherein
   the ground fault detection circuit includes:
   a third transistor that is brought into conduction by an occurrence of the ground fault at the output terminal;
   a fourth transistor that constitutes a current mirror circuit with the third transistor; and
   a ground fault detection result output circuit configured to generate the ground fault detection result based on a current flowing through the fourth transistor.

3. The current detection circuit according to claim 2, further comprising a differential amplifier configured to make a source potential of the first transistor and a source potential of the second transistor a same so that a current proportional to the first current flows through the second transistor, wherein
   the ground fault detection circuit further includes:
   a first diode that is connected between one input terminal of the differential amplifier and a connection point between the first transistor and the output terminal;
   a second diode that is connected between the third transistor and the one input terminal of the differential amplifier; and
   a current source that is connected between the one input terminal of the differential amplifier and a reference potential point.

4. The current detection circuit according to claim 3, further comprising a third diode that is connected between the second transistor and another input terminal of the differential amplifier.

5. The current detection circuit according to claim 3, wherein
   the ground fault detection circuit further includes:
   a resistor that is connected between the fourth transistor and the reference potential point; and
   a fifth transistor having a control terminal connected to a connection point between the fourth transistor and the resistor, a first terminal connected to a power supply terminal via an active load, and a second terminal connected to the reference potential point.

6. The current detection circuit according to claim 5, further comprising an inverter configured to invert a voltage at the first terminal of the fifth transistor to apply the inverted voltage to the logical circuit.

7. The current detection circuit according to claim 5, further comprising a P-type sixth transistor connected between the fourth transistor and the resistor and having a control terminal to which a predetermined voltage is applied.

8. The current detection circuit according to claim 5, further comprising an N-type seventh transistor connected between the fourth transistor and the resistor and having a control terminal that is connected to the power supply terminal.

\* \* \* \* \*